(12) United States Patent
Fujita

(10) Patent No.: US 6,518,843 B1
(45) Date of Patent: Feb. 11, 2003

(54) VARIABLE GAIN TYPE AMPLIFIER

(75) Inventor: Masanori Fujita, Tokyo (JP)

(73) Assignee: NEC Compound Semiconductor Devices Ltd. (JP)

( * ) Notice: Subject to any disclaimer, the term of this patent is extended or adjusted under 35 U.S.C. 154(b) by 70 days.

(21) Appl. No.: 09/694,220

(22) Filed: Oct. 23, 2000

(30) Foreign Application Priority Data

Nov. 1, 1999 (JP) .............................................. 11-311301

(51) Int. Cl.[7] .................................................. H03G 3/20
(52) U.S. Cl. ........................................ 330/284; 330/133
(58) Field of Search ................................ 330/133, 134, 330/144, 145, 284, 285

(56) References Cited

U.S. PATENT DOCUMENTS 4,320,348 A * 3/1982 Suzuki et al. ........... 330/284 X
5,204,637 A * 4/1993 Trinh ...................... 330/284 X

FOREIGN PATENT DOCUMENTS

| JP | 62-226705 | 10/1987 |
| JP | 7-79132 | 3/1995 |
| JP | 9-36677 | 2/1997 |

OTHER PUBLICATIONS

Korean Office Action issued Aug. 28, 2002 (w/ English translation of relevant portion).

* cited by examiner

Primary Examiner—Steven J. Mottola
(74) Attorney, Agent, or Firm—Dickstein, Shapiro, Morin & Oshinsky, LLP.

(57) ABSTRACT

A variable gain type amplifier includes a first amplifying circuit, an attenuating circuit connected to an output of the first amplifying circuit, and a second amplifying circuit connected to an output of the first amplifying circuit. An amplification of the first amplifying circuit is adjusted based on a control voltage, and an attenuation of the attenuating circuit is adjusted based on the control voltage.

22 Claims, 8 Drawing Sheets

VARIABLE GAIN TYPE AMPLIFIER

BACKGROUND OF THE INVENTION

1. Field of the Invention

The present invention relates to a variable gain type amplifier.

2. Description of the Related Art

An amplifier having a large amplification gain or amplification quantity is composed of a plurality of amplifying circuits connected tin series. The plurality of amplifying a signal step by step. Generally, each of the plurality of amplifying circuits has a gain control function. An amplifier having a gain control function is called a variable gain type amplifier.

FIG. 1 shows a conventional variable gain type amplifier. Referring to FIG. 1, a variable gain type amplifier 1 is composed of a first amplifying circuit 11, a second amplifying circuit 12 and an attenuating circuit 13.

The first amplifying circuit 11 is connected with the output of the attenuating circuit 13. The second amplifying circuit 12 is connected with the output of the first amplifying circuit 11. An input signal S1 is supplied to the attenuating circuit 13. The second amplifying circuit 12 outputs an output signal S2. A power supply voltage VDD and a control voltage VAGC are applied to the attenuating circuit 13. The power supply voltage VDD is applied with the first amplifying circuit 11 and the second amplifying circuit 12.

The first amplifying circuit 11 is composed of a transistor circuit which amplifies the input signal. The second amplifying circuit 11 is composed of a transistor circuit which amplifies the input signal. The attenuation circuit 13 is composed of a transistor circuit which attenuates the input signal.

The amplification quantity (Gp1) of the first amplifying circuit 11 is fixed, and is set to 12 dB. The first amplifying circuit 11 has a noise figure of 2 dB (NF1). The amplification quantity (Gp2) of the second amplifying circuit 12 is fixed, and is set to 12 dB. The second amplifying circuit 12 has a noise figure of 3 dB (NF2). The attenuation quantity of the attenuating circuit 13 is changed in accordance with the value of the control voltage VAGC. The attenuation quantity of the attenuating circuit 13 is varied from a range of 40 to 1 dB when the value of the control voltage VAGC is varied from a range of 40 to 1 dB when the value of the control voltage VAGC is varied from a range of 0.5 to 2.5 V. During the operation of the variable gain type amplifier 1, the power supply voltage VDD is kept constant. In this way, the gain of the variable gain type amplifier 1 is determined based on the control voltage VAGC.

Hereinafter, the relation of a total amplification quantity (Gp-A) and the total noise figure (NF-A) in the variable gain type amplifier 1 will be described with reference to the total noise figure (NF-B) of FIG. 7. When the control voltage VAGC is 2.5 V, the attenuation quantity of the attenuating circuit 13 is set to 1 dB. In this case, the total amplification quantity (Gp-A) of the variable gain type amplifier 1 is set to 23 dB. Also, the total noise figure (NF-A) of the variable gain type amplifier 1 is set to 4.7 dB.

When the control voltage VAGC is decreased to 2.0 V, the attenuation quantity of the attenuating circuit 13 is set to 6 dB. In this case, the total amplification quantity (Gp-A) of the variable gain type amplifier 1 is set to 18 dB. Also, the total noise figure (NF-A) of the variable gain type amplifier 1 is set to 7.7 dB.

When the control voltage VAGC is decreased to 1.5 V, the attenuation quantity of the attenuating circuit 13 is set to 11 dB. In this case, the total amplification quantity (Gp-A) of the variable gain type amplifier 1 is set to 13 dB. Also, the total noise figure (NF-A) of the variable gain type amplifier 1 is set to 11.7 dB.

The technique relating to distortion control of the variable gain type amplifier is disclosed in Japanese Laid Open Patent Application (JP-A-Showa 62-226705). In this reference, an attenuating circuit is arranged between two amplifying circuits. However, in this reference, only an attenuation quantity of the attenuating circuit is controlled based on a control voltage.

When a variable gain type amplifier is provided in an amplification stage of a transmitter section of a handheld phone, the variable gain type amplifier generates reception interfering wave to other handheld phones which are in the reception state in the neighborhood. The reception band noise figure (dBm/Hz) indicates the degree of the reception interference and can be expressed by Gp+NF+IM+ thermal noise. Here, Gp is a total amplification quantity of the amplifier, NF is a total noise figure of the amplifier, IM is an intermodulation distortion of the amplifier, and the thermal noise is called kTB noise, and is calculated by use of the Boltzman's constant, temperature and bandwidth. The thermal noise is constant to be −173.9 (dBm/Hz) in the temperature of 25° C.

When a handheld phone is used, it is necessary to control the magnitude of the output signal based on its position from a base station in order to save power. Such reception band noise does not cause any problem since the other users are hardly in the neighborhood, when the position for the handheld phone to be used is far from the base station. On the other hand, when the position of the handheld phone is near the base station, the probability of reception interference is high because a lot of other users are in the neighborhood. Therefore, when the position of the handheld phone is near the base station, i.e., when the transmission output is made small, the reception band noise should be made small. For this purpose, it is necessary to decrease the reception band noise when the total amplification quantity is decreased in the variable gain type amplifier provided in the amplification stage of the transmitter section.

However, as shown in FIG. 7, even when the total amplification quantity (Gp-A) is decreased in the conventional variable gain type amplifier 1, the total noise figure (NF-B) is largely increased. Therefore, the reception band noise index (TXN-B) is almost unchanged. Therefore, when the conventional variable gain type amplifier 1 is used for the amplification stage of the transmitter section in the handheld phone, the conventional variable gain type amplifier 1 gives large reception interference to other handheld phones near the base station.

Also, in the variable gain type amplifier having the structure disclosed in Japanese Laid Open Patent Application (JP-A-Showa 62-226705), the attenuating circuit is arranged between two amplifying circuits. Therefore, when the attenuation quantity of the attenuating circuit is large in order to decrease the total amplification quantity, the intermodulation distortion (IM) increase. Also, the reception band noise can't be small when the total amplification quantity is decreased.

SUMMARY OF THE INVENTION

Therefore, an object of the present invention is to provide a variable gain type amplifier, in which reception band noise can be decreased or not changed when an attenuation quantity of an attenuating circuit is increased.

Another object of the present invention is to provide a variable gain type amplifier, which is suitable for use for an amplification stage of a transmitter of a handheld phone.

In order to achieve an aspect of the present invention, a variable gain type amplifier includes a first amplifying circuit, an attenuating circuit connected to an output of the first amplifying circuit, and a second amplifying circuit connected to an output of the first amplifying circuit. An amplification of the first amplifying circuit is adjusted based on a control voltage, and an attenuation of the attenuating circuit is adjusted based on the control voltage.

Here, it is desirable that the attenuation of the attenuating circuit is increased based on the control voltage, when the control voltage is decreased in a predetermined voltage range. In this case, the amplification of the first amplifying circuit is not substantially changed when the control voltage is changed in a first range of the predetermined voltage range. Also, the amplification of the first amplifying circuit is decreased when the control voltage is decreased in a second range of the predetermined voltage range.

Also, it is desirable that the first amplifying circuit is of a self bias type. In this case, the first amplifying circuit may include a field effect transistor and a bias of a gate of the field effect transistor may be determined based on the control voltage. Also, the first amplifying circuit may be of a source follower type.

Also, it is desirable that the second amplifying circuit is of a self bias type using a power supply voltage. In this case, the second amplifying circuit may be of a source follower type.

Also, it is desirable that the attenuating circuit is of a π type. In this case, the attenuating circuit may include a field effect transistor and a bias of a gate of the field effect transistor may be determined based on a power supply voltage. Instead, the attenuating circuit may include a field effect transistor and a bias of a gate of the field effect transistor may be determined based on the control voltage. Otherwise, the attenuating circuit may include two field effect transistors and a bias of a gate of each of the field effect transistors may be determined based on a power supply voltage.

Also, the attenuating circuit may include an N-channel field effect transistor and a bias of a source of the field effect transistor may be the control voltage. Instead, the attenuating circuit may include two N-channel field effect transistors and a bias of a drain of each of the field effect transistors may be determined based on the control voltage.

Also, the attenuating circuit my include an N-channel field effect transistor and a drain of the field effect transistor may be grounded via a resistor and a capacitor. Instead, the attenuating circuit may include two N-channel field effect transistors connected in series via a first capacitor and a drain of a first one of the field effect transistors may be grounded via a parallel circuit of a circuit of a first resistor and a second capacitor and a second resistor.

Also, it is desirable that the attenuating circuit includes an N-channel field effect transistor and a drain and source of the field effect transistor is connected by a resistor.

In order to achieve another aspect of the present invention, a variable gain type amplifier used for a transmitter of a handheld phone, includes a first amplifying circuit operating based on a control voltage, an attenuating circuit connected to an output of the first amplifying circuit, and operating based on a control voltage, and a second amplifying circuit connected to an output of the first amplifying circuit. In this case, amplification of the first amplifying circuit is decreased or not changed when attenuation of the attenuating circuit is increased based on the control voltage.

Also, the attenuation of the attenuating circuit is increased based on the control voltage, when the control voltage is decreased in a predetermined voltage range. In this case, the amplification of the first amplifying circuit is not substantially changed when the control voltage is changed in a first range of the predetermined voltage range. Also, the amplification of the first amplifying circuit is decreased when the control voltage is decreased in a second range of the predetermined voltage range.

DESCRIPTION OF THE PREFERRED EMBODIMENTS

Hereinafter, a variable gain type amplifier of the present invention will be described below in detail with reference to the attached drawings.

Figure 3:
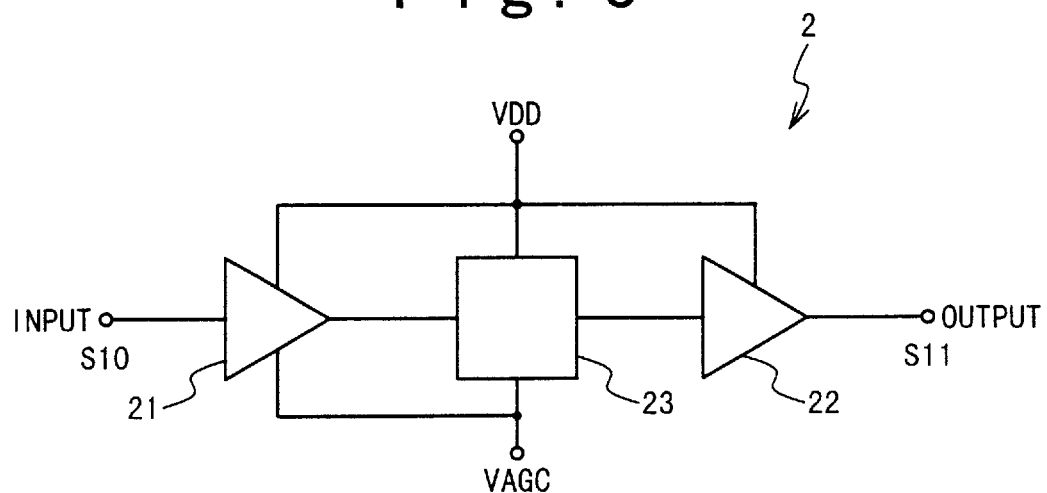
FIG. 3 is a block diagram showing the variable gain type amplifier according to a first embodiment of the present invention.

FIG. 3 is a block diagram showing the variable gain type amplifier according to the first embodiment of the present invention. Referring to FIG. 3, the variable gain type amplifier 2 is composed of a first amplifying circuit 21, a second amplifying circuit 22 and an attenuating circuit 23.

The attenuation circuit 23 is connected to the output of the first amplifying circuit 21. The second amplifying circuit 22 is connected with the output of the attenuating circuit 23. An input signal S10 is supplied to the first amplifying circuit 21. The second amplifying circuit 22 outputs an output signal S11. The power supply voltage VDD is applied to the first amplifying circuit 21 and the second amplifying circuit 22. The power supply voltage VDD and a control voltage VAGC are supplied to the attenuating circuit 23.

The first amplifying circuit 21 is composed of a transistor circuit which amplifies an input signal. The second amplifying circuit 22 is composed of a transistor circuit which amplifies an input signal. The attenuation circuit 23 is composed of a transistor circuit for attenuating an input signal.

The control voltage VAGC is used to set the attenuation of the attenuating circuit 23. The attenuation quantity of the attenuating circuit 23 is adjusted in accordance with the voltage of the control voltage VAGC. The control voltage VAGC is also supplied to the first amplifying circuit 21. The amplification quantity of the first amplifying circuit 21 is changed or adjusted in accordance with the voltage with the control voltage VAGC.

The amplification quantity (Gp1) of the first amplifying circuit 21 is set to 12 dB when the first amplifying circuit 21 is in a reference condition. In this case, the reference noise figure (NF10) of the first amplifying circuit 21 is set to 2 dB when a reference amplification quantity (Gp10) is set. The amplification quantity (Gp1) of the first amplifying circuit 21 is changed in accordance with the control voltage VAGC. The amplification quantity (Gp1) of the first amplifying circuit 21 is decreased when the attenuation quantity (Gp1) of the attenuating circuit 23 is increased. The amplification quantity (Gp2) of the second amplifying circuit 22 is set to 12 dB. The second amplifying circuit 22 has the noise figure of 3 dB (NF2). The attenuation quantity of the attenuating circuit 23 varies in accordance with the value of the control voltage VAGC. The attenuation quantity (Ga) of the attenuating circuit 23 varies from a range of 40 to 1 dB when the value of the control voltage VAGC varies from a range of 0.5 to 2.5 V.

When the control voltage VAGC meets the relation of 2.5 V≧VAGC≧1.5 V, the attenuation quantity (Ga) of the attenuating circuit 23 indicates −1 dB≧Ga ≧−11 dB. In this case, the amplification quantity (Gp1) of the first amplifying circuit 21 is substantially fixed to 12 dB. When the control voltage VAGC is 1.5 V>VAGC≧0.5 V, the attenuation quantity (Ga) indicates −11 dB>Ga>−40 dB. In this case, the amplification quantity (Gp1) of the first amplifying circuit 21 indicates Ga<12 dB.

When the variable gain type amplifier 2 of the present invention is mounted on the transmitter, the rise of the total noise figure can be suppressed if the total amplification quantity is decreased. Moreover, since intermodulation distortion is increased, the reception band noise is reduced.

Figure 4:
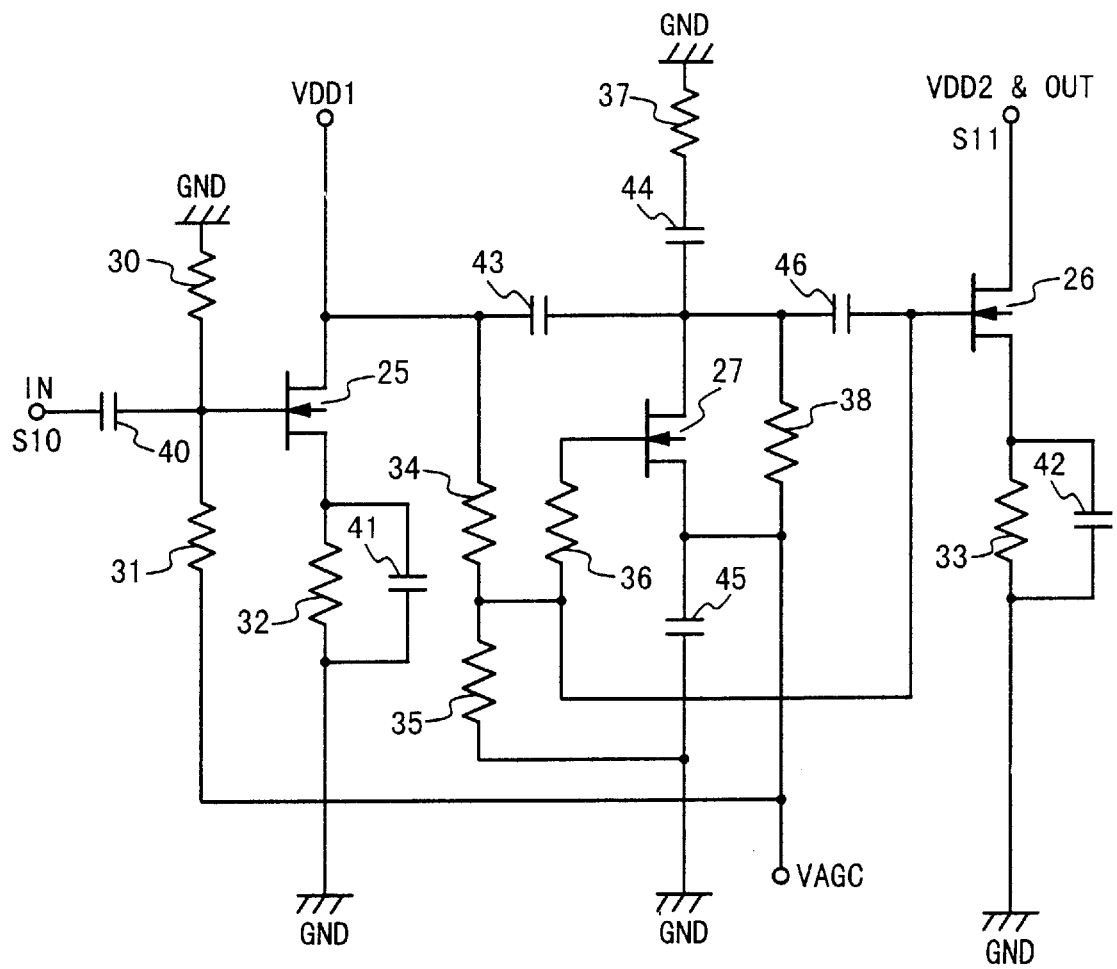
FIG. 4 is a circuit diagram showing the structure of the variable gain type amplifier according to the first embodiment of the present invention.

FIG. 4 shows the structure of the variable gain type amplifier 2 according to the first embodiment of the present invention. Referring to FIG. 4, the variable gain type amplifier 2 is composed of N-channel GaAs depletion type transistors, namely, transistors 25 to 27, capacitors 40 to 45, and resistant 30 to 38.

The first amplifying circuit 21 is composed of a transistor 25, capacitors 40 and 41, and resistances 30 to 32. An input terminal IN is connected with the input of the first capacitor 40. The output of the first capacitor 40 is connected with the gate of the first transistor 25. Also, the output of the first capacitor 40 is connected with a node between the first resistance 30 and the second resistance 31. The other end of the first resistance 30 is connected with a ground terminal. The other end of the second resistance 31 is connected with the control voltage terminal to which the control voltage VAGC is applied. The drain of the first transistor 25 is connected with a first power terminal to which a first power supply voltage VDD1 is applied. The source of the first transistor 25 is connected with one end of the second capacitor 41 and one end of the third transistor 32. The other end of the second capacitor 41 and the other end of the third resistance 32 are connected wit the ground terminal.

The attenuation circuit 23 is composed of a transistor 27, and capacitors 43 to 46, and resistances 34 to 38. One end of the capacitor 43 is connected with the drain of the transistor 27. The drain of the third transistor is connected with one end of the fifth capacitor 44. The other end of the fifth capacitor 44 is connected with one end of the eight resistance 37. The other end of the eighth resistance 37. The other end of the eighth resistance 37 is connected with the ground terminal. The one end of the fifth resistance 34 is connected with the drain of the first transistor 25. The other end of the fifth resistance 34 is connected with one end of the sixth resistance 35. The other end of the sixth resistance 35 is connected with the ground terminal. Also, the other end of the sixth resistance 35 is connected with one of the seventh resistance 36. The other end of the seventh resistance 36 is connected with the gate of the third transistor 27. The source of the third transistor 27 is connected with tone end of the sixth capacitor 45. The other end of the sixth transistor 45 is connected with the ground terminal. Also, the source of the third transistor 27 is connected with one end of the ninth resistance 38 and the control voltage terminal. The other end of the ninth resistance 38 is connected with one end of the seventh capacitor 46 and the drain of the third transistor 27. The other end of the seventh capacitor 46 is connected with the one end of the seventh resistance 36.

The second amplifying circuit 22 is composed of a second transistor 26, a third capacitor 42 and a third resistance 33. The gate of the second transistor 26 is connected with the other end of the seventh capacitor 46. The source of the second transistor 26 is connected with one end of the third capacitor 42 and one end of the fourth resistance 33. The other end of the third capacitor 42 and the other end of the fourth resistance 33 are connected with the ground terminal. The drain of the second transistor 26 is connected with an output terminal OUT. The output terminal OUT shows a second power supply voltage VDD2. In this case, the eighth resistance 37 and the fifth capacitor 44 operate for the impedance matching of the attenuating circuit 23.

The first amplifying circuit 21 amplifies the input signal S10 supplied from the input terminal IN. The attenuation circuit 23 attenuates the output signal of the first amplifying circuit 21. The second amplifying circuit 22 amplifies the output signal of the attenuating circuit 23. The second amplifying circuit 22 outputs an output signal S11.

Figure 5:
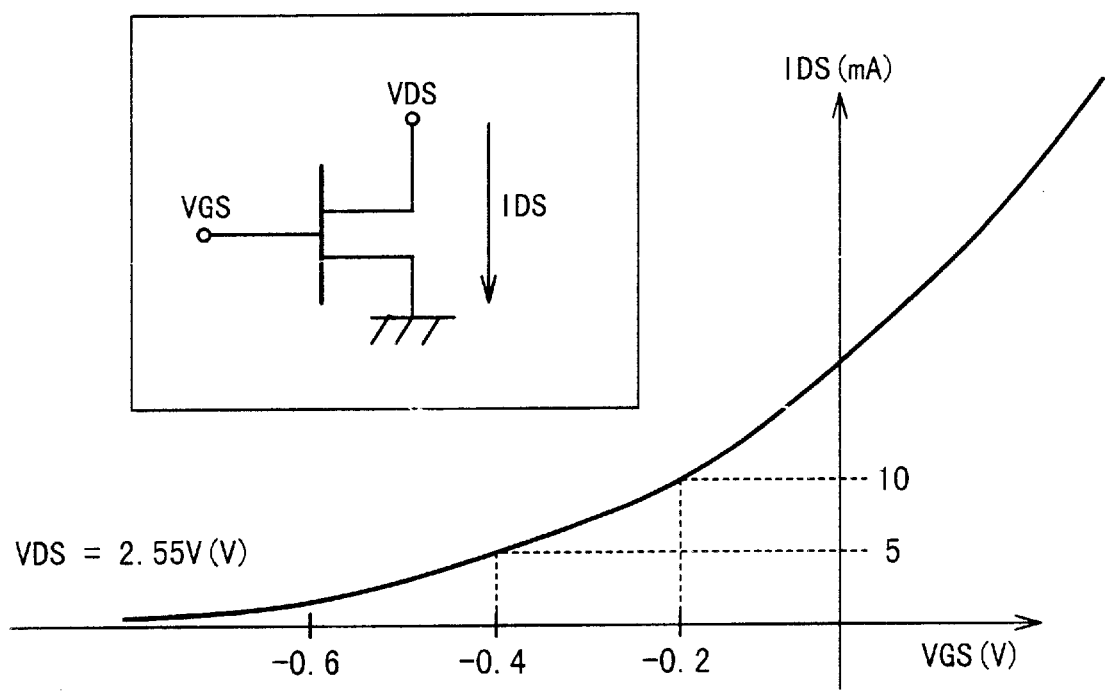
FIG. 5 is a current characteristic diagram of a first transistor used in the variable gain type amplifier according to the first embodiment of the present invention.

FIG. 5 shows the current characteristic of the first transistor 25 in the present invention. In FIG. 5, the horizontal axis shows voltage VGS between the gate and the source. The vertical axis in FIG. 5 shows current IDS flowing between the drain and the source. Drain voltage is set to 2.55 V. FIG. 5 shows the state in which the current IDS increases rapidly when the voltage VGS between the gate and the source increases from the voltage of −0.6 V. When the voltage VGS between the gate and the source is changed from −0.4 V to −0.2 V, the current IDS is changed from 5 mA to 10 mA.

In the first embodiment, the voltage VGS between the gate and the source is set in accordance with the control voltage VAGC. The control voltage VAGC is sued to decrease the amplification quantity of the first transistor 25 when the attenuation quantity of the third transistor 27 is increased. That is, when the control voltage VAGC is decreased, the attenuation quantity by the third transistor 27 is increased. Also, when the control voltage VAGC is decreased, the voltage VGS of the first transistor 25 is decreased so that the amplification of the first transistor 25 is decreased.

The threshold voltage Vth of the first transistor 25 is set to 0.6 V. The first power supply voltage VDD1 is set to 3.0

V. The second power supply voltage VDD2 is set to 3.3 V. The control voltage VAGC is set to 0.5 V to 2.5 V.

The drain voltage VD1 of the first transistor 25 is shown as VD1=VDD1=3.0 V. the first transistor 25 and the second transistor 26 operate in a self-bias system. These transistors can drive in positive voltage.

The source voltage VS1 of the first transistor 25 is higher than the voltage of the ground terminal through the operation of the third resistance (the source resistance) 32. When the current between the drain and the source is set to 10 mA in the first transistor 25, the value of the third resistance 32 is set to 45Ω. The voltage VDS1 between the drain and the source in the first transistor 25 is set to 2.55 V. The value of the third resistance 32 is set based on the threshold voltage Vth of the first transistor 25, the setting current and the time constant which is determined based on the first and second resistances.

The gate voltage VG1 of the first transistor 25 indicates the voltage when the control voltage VAGC is divided by the first resistance 30 and the second resistance 31. The resistance value ratio of the first resistance 30 and the second resistance 31 is set to 1.9. Therefore, when the value of the control voltage VAGC is in a range of 0.5 V to 1.0 V, the decrease of the amplification quantity is brought about based on gate voltage VG1. The first resistance 30 is set to a value equal to or greater than 300Ω in order to avoid high frequency. When the resistance value of the first resistance 30 is 500Ω, the resistance value of the second resistance 31 is set to 4.5 kΩ. In this case, the gate voltage VG1 of the first transistor 25 indicates 0.25 V in case of the control voltage VAGC of 2.5 V, and 0.05 V in case of the control voltage VAGC of 0.5 V. In this case, the voltage VGS1 between the gate and the source in the first transistor 25 indicates −0.2 V and −0.4 V in the case of the control voltage VAGC of 0.5 V. The current IDS1 flowing between the drain and the source in the first transistor 25 indicates 10 mA in the case of the control voltage VAGC of 2.5 V and 5 mA in the case of the control voltage VAGC of 0.5 V.

The control voltage VAGC is applied as the source voltage VS3 of the third transistor 27. The flow of current IDS between the drain and the source in the third transistor 27 is limited. The control voltage VAGC is applied to the drain of the third transistor 27 through the ninth resistance 38. The drain voltage VD2 of the third transistor 27 indicates the value equal to the source voltage VS3. The voltage divided by use of the fifth resistance 34 and the sixth resistance 35 is applied to the gate of the third transistor 27 through the seventh resistance 36. The ratio of the resistance value of the firth resistance 34 and that of the sixth resistance 35 is 5:1. The sixth resistance 34 is set to a value equal to or more than 300Ω to avoid a high frequency influence. When the resistance value of the fifth resistance 34 is 2.5 kΩ, the resistance value of the sixth resistance 35 is set to 500Ω. The seventh resistance 36 prevents the voltage between the gate and the source in the third transistor 27. When the seventh resistance 36 is set to 5 kΩ, the gate voltage VG2 indicates 0.5 V.

When the control voltage VAGC is set to 2.5 V, the voltage VGS3 between the gate and the source in the third transistor 27 indicates −2.0 V. In this case, the third transistor 27 is set to the OFF state. When the control voltage VAGC is set to 0.5 V, the voltage VGS3 between the gate and the source indicates 0 V. In this case, the third transistor 27 is set to the ON state.

The second transistor 26 operates in the self-bias system. The current IDS2 flowing between the drain and the source in the second transistor 26 is set to 15 mA. In this case, the resistance value of the fourth resistance 33 is set to 45Ω. Also, the source voltage VS2 of the second transistor 26 indicates 0.675 V, and the voltage VDS2 between the drain and the source in the second transistor 26 indicates 2.625 V. The gate voltage VG3 of the second transistor 26 is set to 0.5 V. In this case, the voltage VGS2 between the gate and the source in the second transistor 26 indicates −0.175 V, the value of the fourth resistance 33 is appropriately selected in accordance with the threshold voltage of the second transistor 26 and the current setting.

The first, third and sixth capacitors 40,42 and 45 block direct current. The values of theses capacitors are selected in accordance with the operation frequency for the variable gain type amplifier. The values are set to 1 pF t 100 pF in case the operation frequency of 800 MHz to 1 GHz. The values are set to 1 pF to 20 pF when the capacitors are used as part of the matching circuit. Also, the second, fifth and seventh capacitors 41, 44 and 46 connect the high frequency component to the ground. The values of these capacitors are selected in accordance with the operation frequency for the variable gain type amplifier. The values of the capacitors are set to 1 pF to 100 pF in the case of the operation frequency of 800 MHz to 1 GHz. These values are determined in consideration of parasitic inductance components.

The fourth capacitor 43 and the resistance 35 form a shunt. These capacitor and resistance prevent the impedance from acting on the first transistor 25 and the second transistor 26, when the third transistor 27 is changed from the ON state to the OFF state. The fourth capacitor 43 is set to 10 pF to 1000 pF. The sixth resistance 35 is set to a value equal to or less than 300Ω. Especially, the resistance value is set to 100 to 150Ω. When the resistance value exceeds 300Ω, the operation to the high frequency is degraded. When the operation is degraded, the effect to the impedance change decreases. The dumpling effect to the high frequency increases when the resistance value is lower than 100Ω. When the dumpling effect increases, the gain characteristic of the amplifier is degraded.

Figure 6:
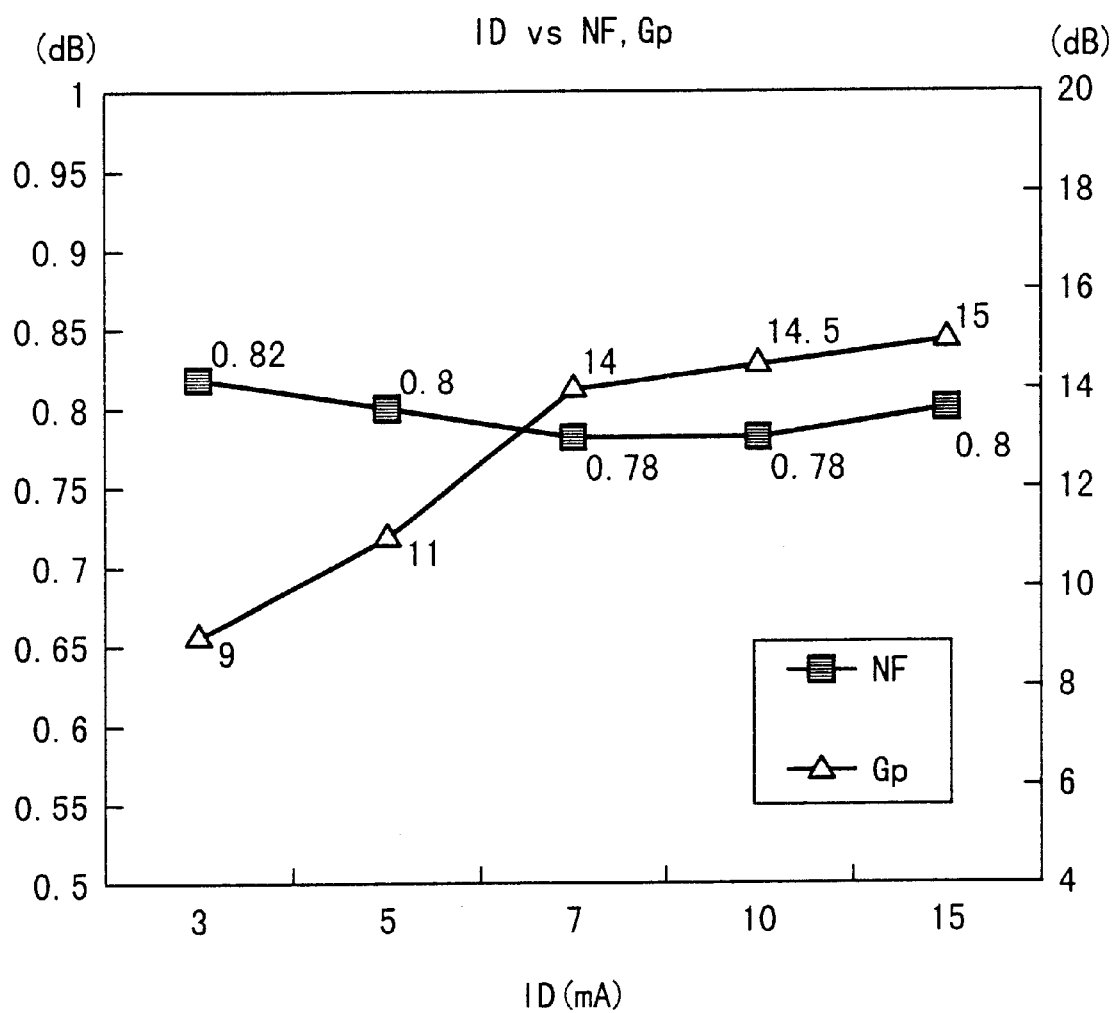
FIG. 6 is a gain characteristic diagram of the first transistor used in the variable gain type amplifier according to the first embodiment of the present invention.

FIG. 6 shows the gain characteristic of the first transistor in the present invention. The horizontal of FIG. 6 shows the drain current ID1 (mA) of the first transistor 25. The left vertical axis of FIG. 6 shows the noise figure (NF1) of the first transistor 25. The right vertical axis of FIG. 6 shows the amplification quantity (Gp1) of the second transistor 26. The noise figure of the first transistor 25 indicates a low value in case of the drain current ID1 of 5 mA to 10 mA. The value of the lowest noise figure indicates 0.78 dB. In this case, the drain current ID1 indicates a range of 7 mA to 10 mA.

The variable gain type amplifier of the present invention may be mounted on a transmitter section in a handheld phone. The operation or function in this case will be described.

Figure 7:
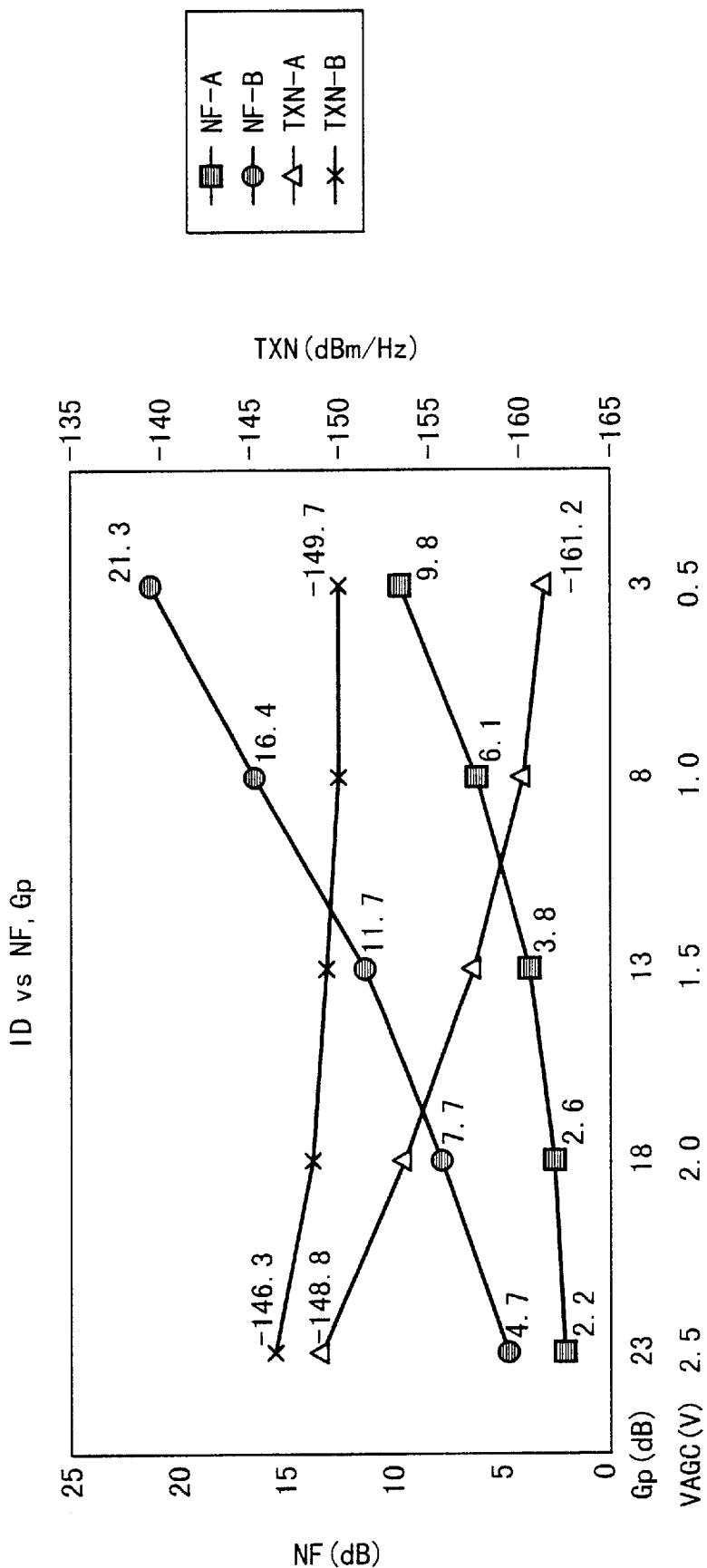
FIG. 7 is an operation characteristic diagram of the variable gain type amplifier according to the first embodiment of the present invention.

FIG. 7 shows the operation characteristic of the variable gain type amplifier of the present invention and the operation characteristic of the conventional variable gain type amplifier. The horizontal axis of FIG. 7 shows the total amplification quantity (Gp) of the variable gain type amplifier. The total amplification quantity (Gp) is proportional to the control voltage VAGC. The left vertical axis of FIG. 7 shows the total noise figure (NF). The right vertical axis of FIG. 7 shows reception band noise index (TXN). The symbol "A" shows the numerical value of the variable gain type amplifier of the present invention, and the symbol "B" shows the numerical value of the conventional variable gain amplifier.

In the variable gain type amplifier 2 of the present invention, when the total amplification quantity (Gp) is changed from 23 dB to 3 dB, the total noise figure (NF) indicates a value of 2.2 dB to 9.8 dB. In this case, the reception band noise figure is in a range of −148.8 dBm/Hz to −161.2 dBm/Hz (TXN). The total noise figure changes by about 12 dB. In the conventional variable gain type amplifier, when the total amplification quantity changes in a range of 23 dB to 3 dB, the total noise figure (NF) indicates the change in a range of 4.7 dB to 21.3 dB. Also, the reception band noise figure indicates a value in range of −146.3 dBm/Hc to −149.7 dBm/Hc. The total noise figure changes by about 17 dB. The reception band noise figure changes by about 2 dB.

The variable gain type amplifier 2 of the present invention has a total noise figure smaller than that of the conventional variable gain type amplifier 1. The increase of the reception band noise is suppressed when the total amplification quantity is made small. Therefore, the reception band noise figure can be improved by 10 dB or more than the conventional variable gain type amplifier when the total amplification quantity is made small.

Figure 1:
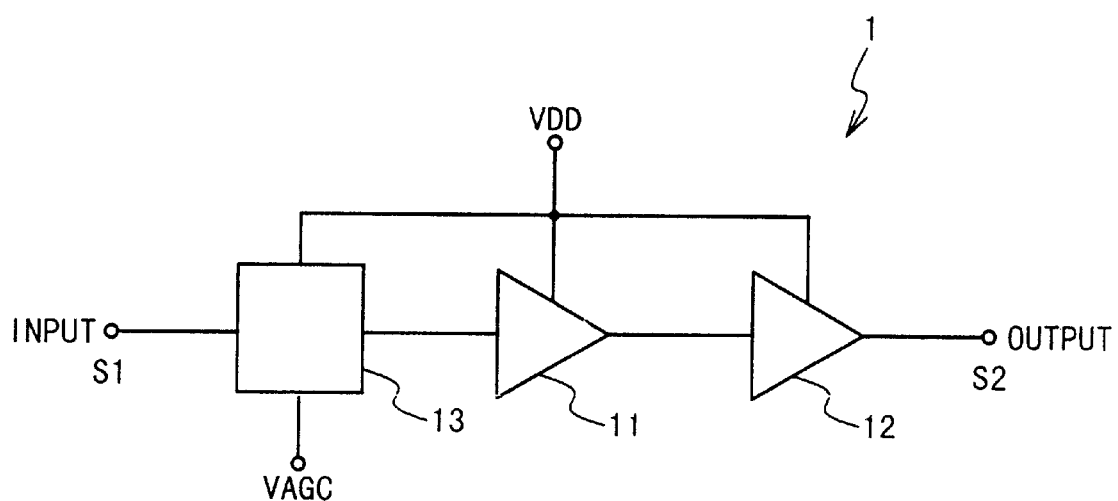
FIG. 1 shows a conventional variable gain type amplifier.
Figure 2:
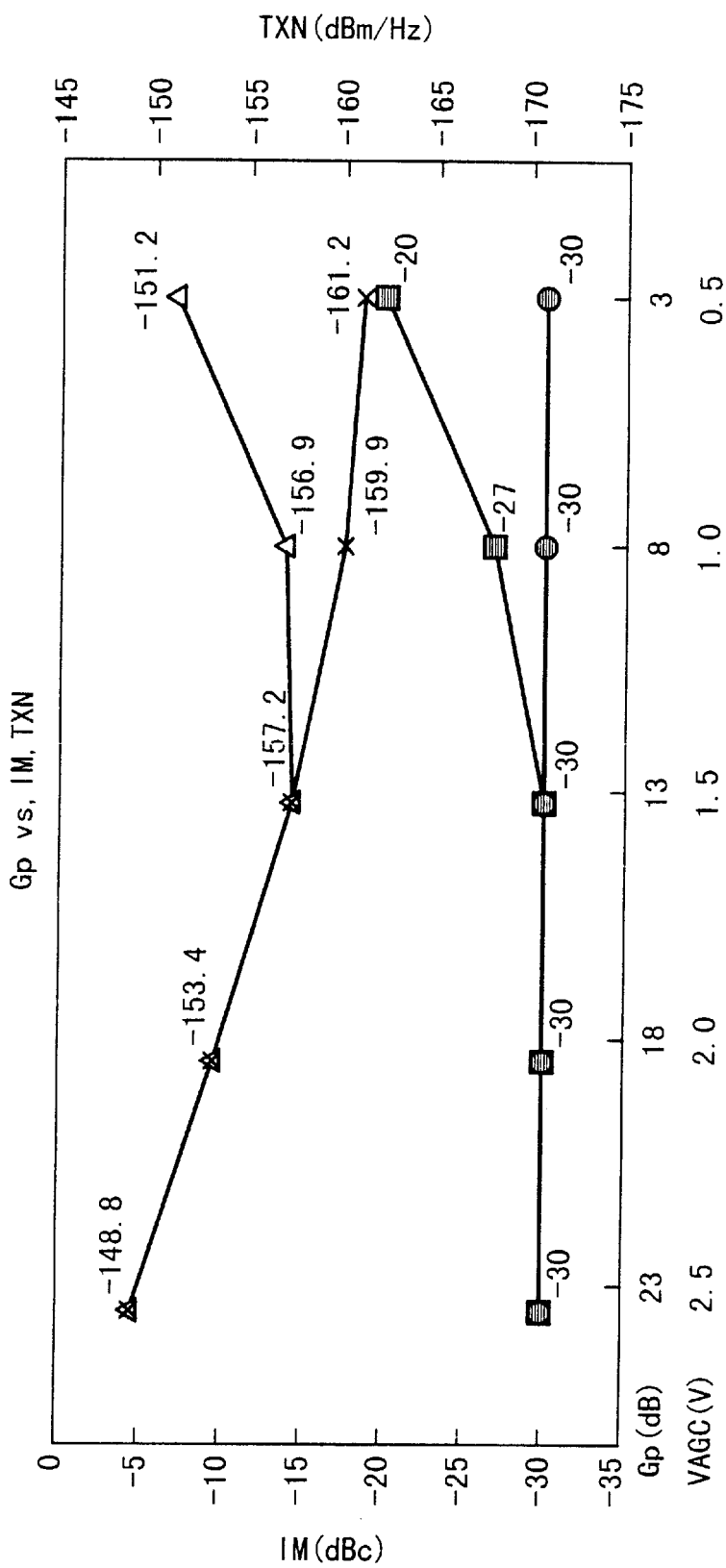
FIG. 2 shows an operation characteristic example of a variable gain type amplifier of the present invention.

It should be noted that in the variable gain type amplifier 2 of the present invention, the voltage VGS between the gate and the source in the first transistor 25 of the first amplifying circuit 21 is changed in accordance with the control voltage VAGC of the attenuating circuit 23. FIG. 2 shows how the intermodulation distortion IM and the reception band noise TXN change when this voltage VGS is fixed.

FIG. 2 shows the operation characteristic example of the variable gain type amplifier of the present invention. In FIG. 2, when the VGS control of the first transistor 25 is not carried out, over-input to the attenuating circuit 23 is created in the region of a small total amplification quantity. Also, the intermodulation distortion IM is increased, compared with a case where the control is carried out in accordance with a control voltage VAGC, i.e., the case of the structure of the present invention. As a result, the reception band noise figure TXN is increased. The circuit disclosed in Japanese Laid Open Patent Application (JP-A-Showa 62-226705) is equivalent to the case that the VGS control of the first transistor 25 is not carried out in accordance with the control voltage VAGC. Here, the itermodulation distortion IM indicates the ratio in the decibel notation when the strength of the carrier is used as a reference value.

Figure 8:
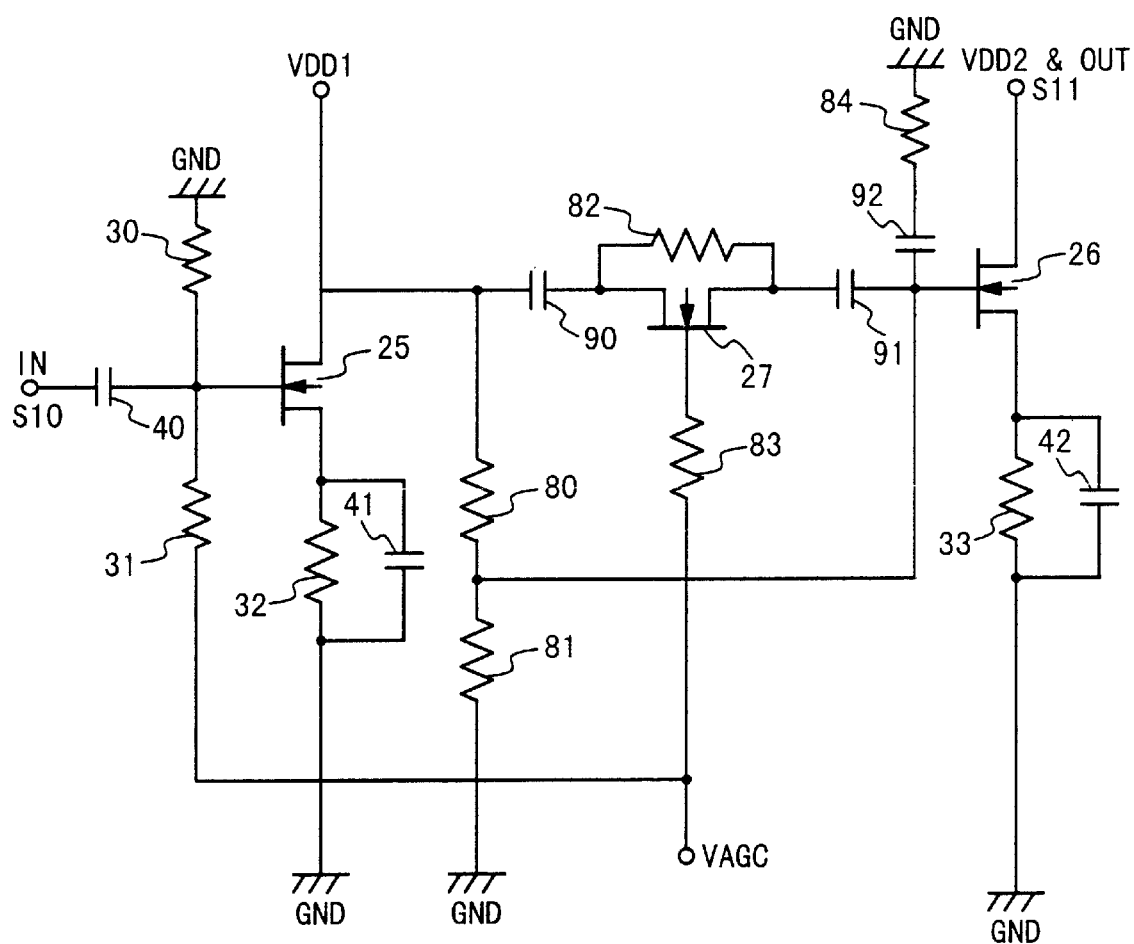
FIG. 8 is a circuit diagram showing the structure of the variable gain type amplifier according to a second embodiment of the present invention.

FIG. 8 shows the circuit structure of the variable gain type amplifier 2 according to the second embodiment of the present invention. Referring to FIG. 8, the variable gain type amplifier 2 is composed of an N-channel GaAs depletion type transistor, namely, first to third transistors 25 to 27, first and second capacitors 40 and 41, third to fifth capacitors 90 to 92, first to fourth resistances 30 to 33 and fifth to ninth resistances 80 to 84.

The first amplifying circuit 21 is composed of the first transistor 25, the first and second capacitors 40 and 41, and the first to third resistances 30 to 32, like the structure shown in FIG. 4.

The attenuation circuit 23 is composed of the third transistor 27, and the fourth to sixth capacitors 90 to 92, and the fifth to ninth resistances 80 to 84. One end of the fourth capacitor 90 is connected with the drain of the first transistor 25. Also, one end of the fourth capacitor 90 is connected with the one end of the fifth resistance 80. The other end of the fifth resistance 80 is connected with one end of the sixth resistance 81. The other end of the sixth resistance 81 is connected with the ground terminal. The other end of the fourth capacitor 90 is connected with the drain of the third transistor. The gate of the third transistor 27 is connected with one end of the eighth resistance 83. The other end of the eighth resistance 83 is connected with the control voltage terminal. The source of the third transistor 27 is connected with one end of the fifth capacitor 91. The drain of the third transistor 27 is connected with one end of the seventh resistance 82. The other end of the seventh resistance 82 is connected with the source of the third transistor 27. The other end of the fifth capacitor 91 is connected with one end of the sixth capacitor 92. The other end of the sixth capacitor 92 is connected with one end of the ninth resistance 84. The other end of the ninth resistance 84 is connected with the ground terminal. The other end of the fifth capacitor 91 is connected with the gate of the second transistor 26.

The second amplifying circuit 22 is composed of the second transistor 26, the third capacitor 42 and the third resistance 33, like the structure shown in FIG. 4.

The variable gain type amplifier shown in FIG. 8 is wider in the varied range of the attenuation quantity than the variable gain type amplifier shown in FIG. 4.

Figure 9:
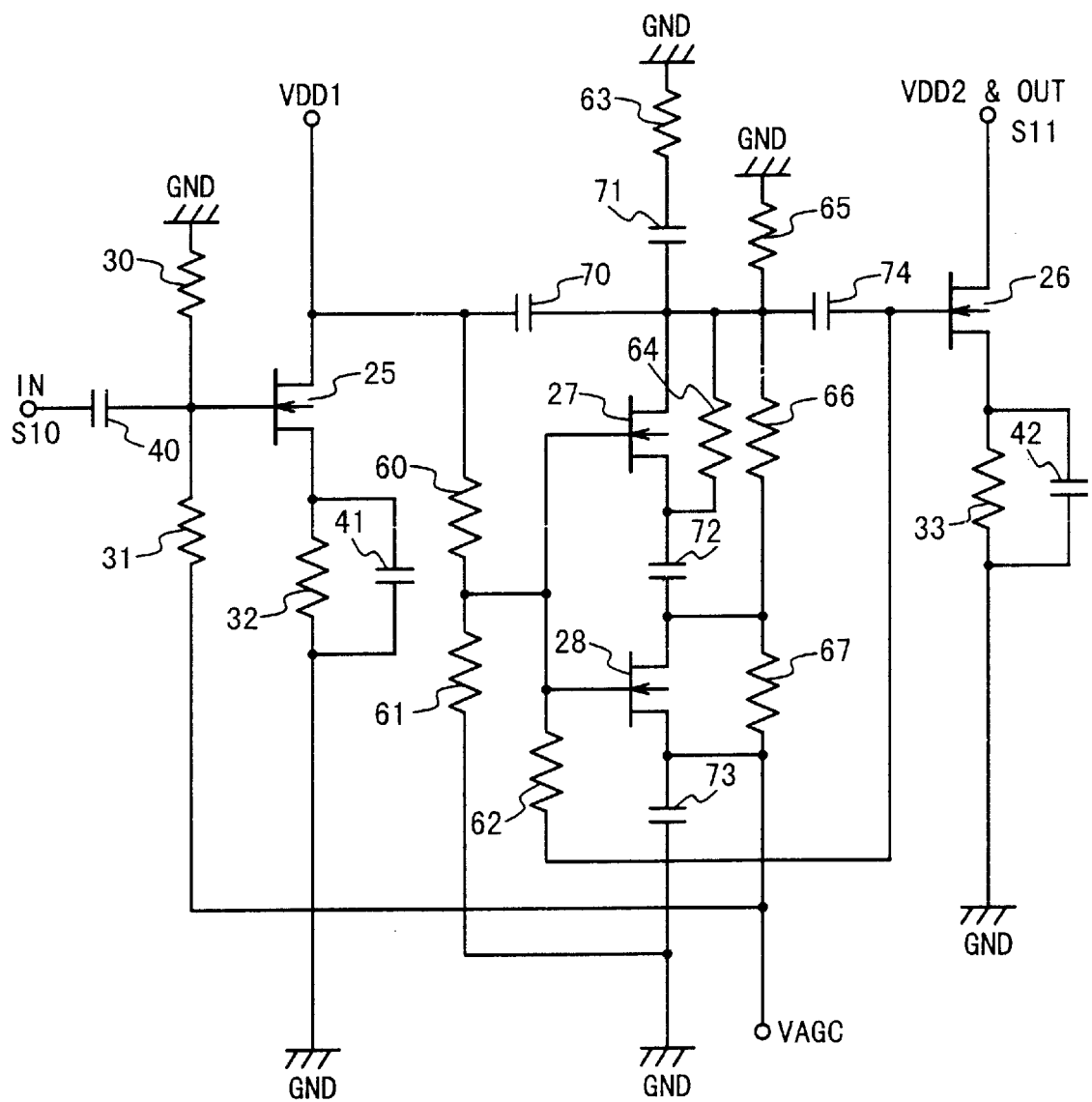
FIG. 9 is a circuit diagram showing the structure of the variable gain type amplifier according to a third embodiment of the present invention.

FIG. 9 shows the circuit structure of the variable gain type amplifier according to the third embodiment of the present invention. The variable gain type amplifier 2 shown in FIG. 9 is composed of an N-channel GaAs depletion type transistor, namely, first to fourth transistors 25 to 28, first to third capacitors 40 to 42, fourth to eighth capacitors 70 to 74, first to fourth resistances 30 to 33, and the fourth to twelfth resistances 60 to 67.

The first amplifying circuit 21 is composed of the first transistor 25, the first and second capacitors 40 and 41, and the first to third resistances 30 to 32, like the first amplifying circuit 21 shown in FIG. 4.

The attenuation circuit 23 is composed of the third transistor 27, the fourth transistor 28, and the fourth to eighth capacitor 70 to 74, and the fifth to twelfth resistance 60 to 67. One end of the fourth capacitor 70 is connected with the drain of the first transistor 25. The other end of the fourth capacitor 70 is connected with the drain of the third transistor. The one end of the fifth resistance 60 is connected with the drain of the first transistor 25. The other end of the fifth resistance 60 is connected with one end of the sixth resistance 61. The one end of the sixth resistance 60 is connected with the gate of the third transistor 27 and the gate of the fourth transistor 28. The other end of the sixth resistance 61 is connected with the ground terminal. The drain of the third transistor is connected with one end of the fifth capacitor 71. The other end of the fifth capacitor 71 is connected with one end of the eighth resistance 63. The other end of the eighth resistance 63 is connected with the ground terminal. One end of the ninth resistance 64 is connected with the drain of the third transistor 27. The other end of the ninth resistance 64 is connected with the source of the third transistor 27. One end of the sixth capacitor 72 is connected the source of the third transistor 27. The other end of the sixth capacitor 72 is connected with the drain of the fourth transistor 28. The source of the fourth transistor 28 is connected with one end of the seventh capacitor 73. The other end of the seventh capacitor 73 is connected with the ground terminal. The source of the fourth transistor 28 is connected with the control voltage terminal. The drain of the third transistor 27 is connected with one end of the eleventh resistance 66. The other end of the eleventh resistance 66 is connected with one end of the twelfth resistance 67. The one end of the twelfth resistance 67 is connected with the drain of the fourth transistor 28. The other end of the twelfth resistance 67 is connected with the control voltage terminal. The drain of the third transistor 27 is connected with one end of the tenth resistance 65. The other end of the tenth resistance 65 is connected with the ground terminal. The drain of the third transistor 27 is connected with one end of the eighth capacitor 74. The other end of the eighth capacitor 74 is connected with the other end of the seventh resistance 62. The other end of the eighth capacitor 74 is connected with the gate of the second transistor 26.

The second amplifying circuit 22 is composed of the second transistor 26, the third capacitor 42 and the third resistance 33, like the second amplifying circuit 22 shown in FIG. 4.

The variable gain type amplifier shown in FIG. 9 is higher in the control precision of the attenuation quantity than the variable gain type amplifier shown in FIG. 4.

The variable gain type amplifier of the present invention can use a P-channel transistor. The attenuating circuit of the variable gain type amplifier of the present invention is not limited to the π type attenuating circuit. The variable gain type amplifier of the present invention can be used for not only the transmitter but also in an amplification stage in which the variable amplification gain is required.

The variable gain type amplifier of the present invention can control the amplification quantity of the first amplifying circuit and the attenuation quantity of the attenuating circuit individually. A second control voltage may be supplied to control the amplification quantity of the first amplifying circuit. In this case, the control voltage VAGC is used for only the control of the attenuation quantity of the attenuating circuit.

According to the variable gain type amplifier of the present invention, even if the attenuation quantity of the attenuating circuit is increased, the total noise figure is no largely increased. In the variable gain type amplifier of the present invention, the amplification quantity of the amplifying circuit in the front stage of the attenuating circuit is decreased when the attenuation quantity of the attenuating circuit is increased. When the amplification quantity is decreased, the over-input to the attenuating circuit can be avoided. As a result, the distortion of the output signal is reduced.

The reception band noise can be decreased when the variable gain type amplifier of the present invention is installed into the transmitter section of the handheld phone. Therefore, when the handheld phone is used near a base station, the reception interference with the handheld phone can be avoided.

What is claimed is:

1. A variable gain type amplifier comprising:
   a first amplifying circuit, wherein amplification of said first amplifying circuit is adjusted based on a control voltage;
   an attenuating circuit connected to an output of said first amplifying circuit, wherein attenuation of said attenuating circuit is adjusted based on said control voltage; and
   a second amplifying circuit connected to an output of said first amplifying circuit.

2. The variable gain type amplifier according to claim 1, wherein said attenuation of said attenuating circuit is increased based on said control voltage, when said control voltage is decreased in a predetermined voltage range.

3. The variable gain type amplifier according to claim 2, wherein said amplification of said first amplifying circuit is not substantially changed when said control voltage is changed in a first range of said predetermined voltage range.

4. The variable gain type amplifier according to claim 3, wherein said amplification of said first amplifying circuit is decreased when said control voltage is decreased in a second range of said predetermined voltage range.

5. The variable gain type amplifier according to claim 2, wherein said first amplifying circuit is of a self bias type.

6. The variable gain type amplifier according to claim 5, wherein said first amplifying circuit includes a field effect transistor and a bias of a gate of said field effect transistor is determined based on said control voltage.

7. The variable gain type amplifier according to claim 6, wherein said first amplifying circuit is of a source follower type.

8. The variable gain type amplifier according to claim 2, wherein said second amplifying circuit is of a self bias type using a power supply voltage.

9. The variable gain type amplifier according to claim 8, wherein said second amplifying circuit is of a source follower type.

10. The variable gain type amplifier according to claim 2, wherein said attenuating circuit is of a π type.

11. The variable gain type amplifier according to claim 10, wherein said attenuating circuit includes a field effect transistor and a bias of a gate of said field effect transistor is determined based on a power supply voltage.

12. The variable gain type amplifier according to claim 10, wherein said attenuating circuit includes a field effect transistor and a bias of a gate of said field effect transistor is determined based on said control voltage.

13. The variable gain type amplifier according to claim 10, wherein said attenuating circuit includes two field effect transistors and a bias of a gate of each of said field effect transistors is determined based on a power supply voltage.

14. The variable gain type amplifier according to claim 10, wherein said attenuating circuit includes an N-channel field effect transistor and a bias of a source of said field effect transistor is said control voltage.

15. The variable gain type amplifier according to claim 10, wherein said attenuating circuit includes two N-channel field effect transistors and a bias of a drain of each of said field effect transistors is determined based on said control voltage.

16. The variable gain type amplifier according to claim 10, wherein said attenuating circuit includes an N-channel field effect transistor and a drain of said field effect transistor is grounded via a resistor and a capacitor.

17. The variable gain type amplifier according to claim 10, wherein said attenuating circuit includes two N-channel field effect transistors connected in series via a first capacitor and a drain of a first one of said field effect transistors is grounded via a parallel circuit of a circuit of a first resistor and a second capacitor and a second resistor.

18. The variable gain type amplifier according to claim 10, wherein said attenuating circuit includes an N-channel field effect transistor and a drain and source of said field effect transistor is connected by a resistor.

19. A variable gain type amplifier used for a transmitter of a handheld phone, comprising:
   a first amplifying circuit operating based on a control voltage;
   an attenuating circuit connected to an output of said first amplifying circuit, and operating based on a control voltage; and
   a second amplifying circuit connected to an output of said first amplifying circuit,
   wherein amplification of said first amplifying circuit is decreased or not changed when attenuation of said attenuating circuit is increased based on said control voltage.

20. The variable gain type amplifier according to claim 19, wherein said attenuation of said attenuating circuit is increased based on said control voltage, when said control voltage is decreased in a predetermined voltage range.

21. The variable gain type amplifier according to claim 20, wherein said amplification of said first amplifying circuit is not substantially changed when said control voltage is changed in a first range of said predetermined voltage range.

22. The variable gain type amplifier according to claim 21, wherein said amplification of said first amplifying circuit is decreased when said control voltage is decreased in a second range of said predetermined voltage range.

* * * * *